United States Patent
Guillot et al.

(10) Patent No.: US 11,101,791 B2
(45) Date of Patent: Aug. 24, 2021

(54) POWER CIRCUIT SWITCHING DEVICE HAVING A PASSIVE PROTECTION CIRCUIT

(71) Applicant: Exagan, Grenoble (FR)

(72) Inventors: Laurent Guillot, Seysses (FR); Thierry Sutto, Seysses (FR); Eric Moreau, Frouzins (FR)

(73) Assignee: Exagan, Grenoble (FR)

( * ) Notice: Subject to any disclaimer, the term of this patent is extended or adjusted under 35 U.S.C. 154(b) by 243 days.

(21) Appl. No.: 16/464,184

(22) PCT Filed: Nov. 22, 2017

(86) PCT No.: PCT/FR2017/053206
§ 371 (c)(1),
(2) Date: May 24, 2019

(87) PCT Pub. No.: WO2018/096263
PCT Pub. Date: May 31, 2018

(65) Prior Publication Data
US 2020/0295743 A1    Sep. 17, 2020

(30) Foreign Application Priority Data

Nov. 25, 2016    (FR) ...................................... 1661531

(51) Int. Cl.
*H03K 17/14*    (2006.01)
*H03K 17/16*    (2006.01)
(Continued)

(52) U.S. Cl.
CPC ............ *H03K 17/08* (2013.01); *H03K 17/687* (2013.01); *H03K 2017/6875* (2013.01); *H03K 2217/0081* (2013.01)

(58) Field of Classification Search
None
See application file for complete search history.

(56) References Cited

U.S. PATENT DOCUMENTS

| | | | |
|---|---|---|---|
| 6,373,318 B1* | 4/2002 | Dohnke | H01L 27/085 257/E27.059 |
| 7,348,826 B1* | 3/2008 | Klein | H03K 17/08148 327/421 |

(Continued)

FOREIGN PATENT DOCUMENTS

| | | |
|---|---|---|
| DE | 102006029928 B3 | 9/2007 |
| DE | 102010027832 B3 | 7/2011 |

(Continued)

OTHER PUBLICATIONS

Wen et al., A Dual-Mode Driver IC with monolithic Negative Drive-Voltage Capability and Digital Current-Mode Controller for Depletion-mode GaN HEMT, IEEE Transactions on Power Electronics, vol. 32, Issue 1, (Jan. 2017), abstract only.

(Continued)

*Primary Examiner* — Kenneth B Wells
(74) *Attorney, Agent, or Firm* — TraskBritt

(57) ABSTRACT

A power circuit switching device comprises two switching terminals, a high-voltage depletion mode transistor and a low-voltage enhancement mode transistor arranged in series between the two switching terminals, a first terminal for receiving a switching signal and electrically connected via a driver circuit to the gate of the high-voltage transistor, and a second terminal for receiving a control signal and electrically connected to the gate of the low-voltage transistor. The device comprises a normally-on protection circuit electrically connected between the second terminal and the gate of the high-voltage transistor to keep the high-voltage transistor in an off-state when the driver circuit is not electrically powered.

19 Claims, 3 Drawing Sheets

(51) Int. Cl.
*H03K 17/687* (2006.01)
*H03K 17/693* (2006.01)
*H03K 17/08* (2006.01)

(56) References Cited

U.S. PATENT DOCUMENTS

| | | | | |
|---|---|---|---|---|
| 7,859,234 | B2* | 12/2010 | Huang | H03K 17/102 |
| | | | | 323/273 |
| 8,487,664 | B2* | 7/2013 | Draxelmayr | H02M 1/08 |
| | | | | 327/108 |
| 8,558,584 | B2* | 10/2013 | Draxelmayr | H03K 5/1515 |
| | | | | 327/108 |
| 9,007,103 | B2* | 4/2015 | Zojer | H03K 17/16 |
| | | | | 327/112 |
| 9,479,159 | B2* | 10/2016 | Zojer | H02M 7/219 |
| 9,559,683 | B2* | 1/2017 | Zojer | H02M 7/219 |
| 9,793,260 | B2* | 10/2017 | Zojer | H03K 17/567 |
| 10,256,811 | B2* | 4/2019 | Chang | H03K 17/693 |
| 10,290,566 | B2* | 5/2019 | Otremba | H01L 29/7838 |
| 10,715,131 | B2* | 7/2020 | Bunin | H03K 17/693 |
| 10,826,485 | B2* | 11/2020 | Randolph | H03K 17/165 |
| 2007/0170897 | A1 | 7/2007 | Williams | |
| 2015/0171750 | A1 | 6/2015 | Zeng et al. | |
| 2016/0308444 | A1 | 10/2016 | Hasegawa et al. | |

FOREIGN PATENT DOCUMENTS

| | | |
|---|---|---|
| DE | 102011083684 B3 | 7/2012 |
| EP | 3001563 A1 | 3/2016 |

OTHER PUBLICATIONS

International Written Opinion for International Application No. PCT/FR2017/053206 dated Feb. 9, 2018, 7 pages.
International Search Report for International Application No. PCT/FR2017/053206 dated Feb. 9, 2018, 3 pages.
French Preliminary Search Report for French Application No. 1661533 dated Jul. 28, 2017, 2 pages.

* cited by examiner

POWER CIRCUIT SWITCHING DEVICE HAVING A PASSIVE PROTECTION CIRCUIT

CROSS-REFERENCE TO RELATED APPLICATIONS

This application is a national phase entry under 35 U.S.C. § 371 of International Patent Application PCT/FR2017/053206, filed Nov. 22, 2017, designating the United States and published as International Patent Publication WO2018/096263 A1 on May 31, 2018, which claims the benefit under Article 8 of the Patent Cooperation Treaty to French Patent Application Serial No. 1661531, filed Nov. 25, 2016.

TECHNICAL FIELD

This invention relates to a dual-control power circuit switching device.

BACKGROUND

Such a device is known from the document "A dual-mode Driver IC with Monolithic Negative Drive-Voltage Capability and Digital Current-Mode Controller for Depletion-Mode GaN HEMT," Yue Wen and Al, IEEE Transaction on Power Electronic, 2016. It includes two switching terminals which make it possible to selectively supply energy to a power circuit connected to its terminals. The device also includes a first terminal for receiving a switching signal electrically connected, via a driver circuit, to the gate of a high-voltage depletion mode transistor.

The off-state of the high-voltage depletion mode transistor is obtained by applying a negative voltage, below its threshold voltage, between the gate and the source of this transistor. As this negative voltage may not be available, for example, when turning on the switching device or when operating in degraded mode, the device is equipped with a low-voltage enhancement mode transistor, connected in series with the high-voltage transistor. By separately "dual controlling" each of the high- and low-voltage transistors connected in series, the open or closed state of the switching circuit is precisely controlled. More precisely, the state of the art switching device includes a second terminal for receiving a control signal, the second terminal being electrically connected to the gate of the low-voltage transistor.

The control signal therefore makes it possible to switch the low-voltage transistor to the off-state and check the open state of the switching device, even in the absence of a negative voltage applied to the gate of the high-voltage transistor.

The switching device may have an "active" operating mode which corresponds to the "normal" operating mode, wherein the open or closed state of the device is controlled by the switching signal. It may also have an "inactive" operating mode that corresponds to the "low consumption" or commissioning mode of the device.

In the latter mode, the switching device is in the open state and the individual active elements of the device are not electrically powered. This is the case, for example, of the driver circuit of the gate of the high-voltage transistor. If there is no power supply, this circuit has a high impedance output, the voltage that applies to the gate of the high-voltage transistor is then floating and uncontrolled. A possible overvoltage on the drain of the high-voltage transistor can then, because of the coupling effect between the drain and the gate, keep, or switch the high-voltage transistor in/to the off-state despite the deactivation of the switching device.

In this case, the entire switched voltage applies to the terminals of the low-voltage transistor. This voltage can be high, for example, higher than 600V, and exceed the avalanche voltage that this transistor can support.

To prevent this problem, the document US20150171750 proposes to place a diode between the gate of the high-voltage transistor and the ground of the device. This diode has the effect of limiting the gate voltage of the high-voltage transistor to a voltage approximately equivalent to the mass of the device (more precisely to the threshold voltage of the diode).

In the quoted document, the driver circuit is electrically connected to the source of the high-voltage transistor. Since the gate voltage Vg of the high-voltage transistor is essentially maintained at zero, the on- or off-state of this transistor is therefore controlled by applying, to the source, the voltage Vs allowing to impose a voltage Vgs between the gate and the source that is higher or lower than the threshold voltage of this transistor. More precisely, the high-voltage depletion mode transistor is closed by applying a zero voltage difference between its gate and its source. This voltage difference, although higher than the threshold voltage, and therefore sufficient to close the transistor, leads to the establishment of a significant drain-source resistor. It is known that the drain-source resistor of such a high-voltage transistor is all the lower as the gate-source voltage, with respect to the threshold voltage, is high. A high drain-source resistor is very detrimental to the energy efficiency of the device when conducting high current intensities.

In addition, and whatever the solution chosen to prevent the unintentional on-state of the high-voltage transistor, the switching from a normal to an inactive operation of the switching device may lead to the occurrence of transient voltages or the flow of transient currents between its terminals. These voltages or currents are likely to damage the high-voltage transistor or the low-voltage transistor if the switching from one operating mode to another is not perfectly controlled.

This disclosure aims at, at least partially, remedying at least one of the above-mentioned issues. In particular, it aims at providing a dual-control switching device that can be safely placed and kept in an inactive mode.

BRIEF SUMMARY

With a view to achieving one of these objectives, the subject of the disclosure proposes, in its broadest acceptance, a power circuit switching device comprising two switching terminals, a high-voltage depletion mode transistor and a low-voltage enhancement mode transistor, the avalanche voltage of the low-voltage transistor being lower than the avalanche voltage of the high-voltage transistor, and arranged in series between the two switching terminals, a first terminal for receiving a switching signal electrically connected via a driver circuit to the gate of the high-voltage transistor and a second terminal for receiving a control signal, electrically connected to the gate of the low-voltage transistor.

According to the disclosure, the switching device includes a normally-on protection circuit and electrically connected between the second terminal and the gate of the high-voltage transistor to keep the high-voltage transistor in an off-state when the driver circuit is not electrically powered.

According to other advantageous and unrestrictive characteristics of the disclosure, taken alone or in any technically feasible combination:

the passive protection circuit comprises a bipolar transistor and a resistor placed in the emitter of the bipolar transistor;

the base of the bipolar transistor is electrically connected to the second terminal, the collector of the bipolar transistor is electrically connected to the ground of the device and the resistor is electrically connected to the gate of the high-voltage transistor;

the protection circuit includes a second resistor between the second terminal and the ground of the device;

the source of the high-voltage transistor is electrically connected to the drain of the low-voltage transistor;

the high-voltage transistor is a GaN- or SiC-based HEMT transistor;

the low-voltage transistor is a silicon-based MOSFET transistor;

the avalanche voltage of the high-voltage transistor is higher than 600V;

the device also includes a control device electrically connected to the first terminal and the second terminal to process the control signal and selectively transmit the switching signal;

the driver circuit is electrically powered by at least one supply voltage source;

the control device is electrically connected to at least one power supply source for selectively switching it on or off.

BRIEF DESCRIPTION OF THE DRAWINGS

Other characteristics and advantages of the disclosure will emerge from the detailed description of the disclosure that follows with reference to the appended figures on which.

DETAILED DESCRIPTION

Figure 1:
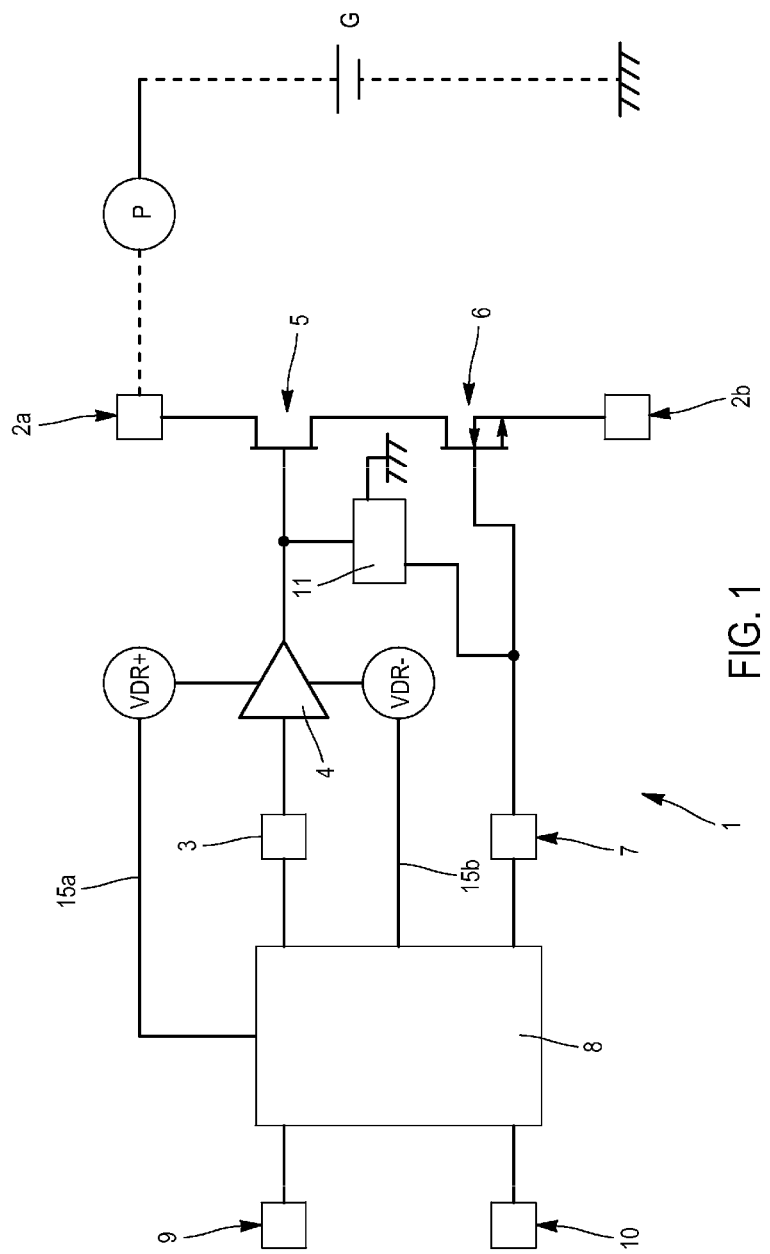
FIG. 1 shows a switching device according to the disclosure.

FIG. 1 shows a switching device 1 according to the disclosure. A load P and a generator G of a power circuit connected to two switching terminals 2a, 2b of the device 1 are shown in dotted lines in this figure.

The generator G can have a high voltage, for example, 600V or more, and the current flowing in the power circuit and in the switching device 1 can be of high intensity, for example, above 1 A. The switching device 1, as is well known per se, selectively applies the generator G voltage to the load P. It therefore acts as a power switch, controlled by a relatively small switching signal of the order of a few volts.

The switching device 1 has a first terminal 3 for receiving this switching signal. This first terminal 3 is electrically connected via a driver circuit 4 to a gate of a high-voltage depletion mode transistor 5.

"High-voltage transistor" means a transistor comprising a drain, a source and a gate, the low amplitude voltage applied to the gate (of the order of a few volts) making it possible to switch the connection between the drain and the source to the on-state or the off-state. In the off-state, the voltage developing between the drain and the source can have a high amplitude, for example, 600V or more, without damaging the transistor.

A depletion mode transistor has a negative threshold voltage (typically between −5V and −2V). The voltage between the gate and the source must therefore be negative, below this threshold voltage, to switch this transistor to the off-state.

The high-voltage enhancement mode transistor can be a GaN- or SiC-based HEMT transistor, for example. This type of transistor has an avalanche voltage (i.e., the maximum voltage applicable between the drain and the source of the transistor without damage, it can be a breakdown voltage) of high amplitude, chosen to be higher than the voltage of the power circuit generator, for example, more than 600V.

In normal operation of the switching device, the source of the high-voltage transistor is at 0V. To enable the high-voltage transistor to be controlled in the on- or off-state depending on the nature of the switching signal, the driver circuit 4 is connected to a first voltage source VDR+ and a second voltage source VDR−. The driver circuit is supplied with a first voltage, from the first source VDR+, the magnitude of which is greater than the threshold voltage of the high-voltage transistor. This can be, for example, a 2V voltage. The driver circuit is also supplied with a second voltage, from the second source VDR−, the magnitude of which is lower than the threshold voltage of the high-voltage transistor. This may be, for example, a −8V voltage. Depending on the value of the switching signal applied to the first input terminal 3, the first voltage or the second voltage is applied to the gate of the high-voltage transistor, thus making it possible to selectively switch it to the on-state or the off-state.

Following the description of the switching device 1 in FIG. 1, the high-voltage transistor 5 is arranged in series with a low-voltage transistor 6 between the two switching terminals 2a, 2b. In other words, the drain of the high-voltage transistor 5 is electrically connected to one of the two switching terminals 2a, 2b, the source of the high-voltage transistor 5 is connected to the drain of the low-voltage transistor 6, and the source of the low-voltage transistor 6 is connected to the other of the two switching terminals 2a, 2b.

An enhancement mode transistor has a positive threshold voltage. The voltage between the gate and the source must therefore be positive and higher than this threshold voltage, to switch this transistor to the on-state.

The low-voltage transistor can be a silicon-based MOSFET transistor. The avalanche voltage of the low-voltage transistor is lower than that of the high-voltage transistor. It may be of the order of 30V, for instance.

A second terminal 7 of the switching device 1 is connected to the gate of the low-voltage transistor 6. This second terminal 7 is designed for receiving a control signal.

As shown in the schematic diagram in FIG. 1, a positive control signal higher than the low-voltage transistor threshold voltage applied to the second terminal 7 switches the low-voltage transistor to the on-state, the source of the low-voltage transistor being connected to the circuit ground. In this first operating mode (which corresponds to the normal active operating state of device 1), the open or closed state of switching device 1 is dictated by the switching signal applied to the first terminal 3.

On the contrary, when the control signal with a voltage below the threshold voltage of the low-voltage transistor is applied to the second terminal 7, the low-voltage transistor is placed in an off-state mode. In this operating mode, the switching device 1 is in the open state, regardless of the value of the switching signal applied to the first input terminal 3. It should be reminded that, when the device 1 is in this open state, the control signal having a voltage below the threshold voltage of the low-voltage transistor, the drain of this transistor has a floating voltage which, drawn by the leakage current of the high-voltage transistor, is established at the avalanche voltage of the low-voltage transistor, which as mentioned above can be 30V.

The switching device 1 also includes a control circuit 8 for processing the control signal and/or transmitting the switching signal, depending on the active or inactive operating mode of the switching device 1. The control circuit 8 has two outputs, respectively, electrically connected to the first terminal 3 and to the second terminal 7. The control circuit also includes a first input 9 for receiving the switching signal and a second input 10 for receiving a signal to activate the device 1.

To enable the control circuit 8 to control the turning on, turning off and check the proper functioning of the voltage sources VDR+, VDR−, the control circuit 8 is connected to these power sources via electrical connections 15a, 15b.

According to one aspect of the disclosure, the control circuit 8 forms a state machine making it possible to put the device in one of the operating modes of the device 1 and for controlling the safe transition between these modes, as described in the following paragraphs. The control circuit 8 can be integrated, for example, as a programmable logic gate system or as discrete components, or even as a microcontroller suitably programmed to reproduce the behavior detailed below.

The control circuit 8 is electrically connected to the gates of the high-voltage and low-voltage transistors to control the off-state or on-state of these transistors, particularly when switching from one operating mode of the device to another. Individually and directly controlling the transistor gates, makes it possible to protect against transient effects that could develop and damage one of the transistors. This also protects against unsecured operation of the device.

Figure 2:
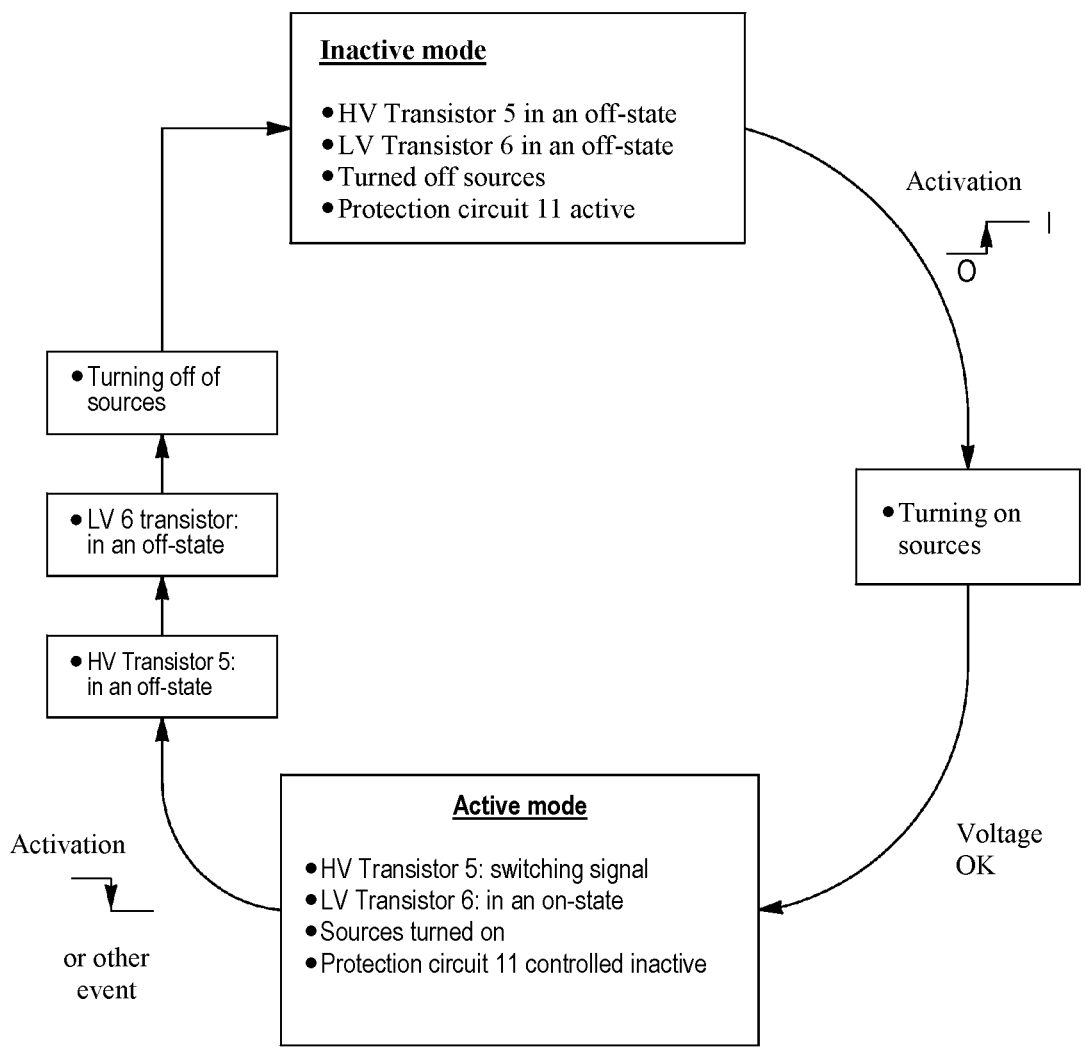
FIG. 2 shows the transition diagram between an active and an inactive mode of a switching device according to the disclosure.

As schematically represented by the transition model in FIG. 2, the operating mode of the device 1 is determined by the level of an activation signal applied to the second input 10 of the control circuit 8.

When this activation signal has a first level (e.g., 5V), the switching device 1 is controlled in normal, i.e., active operation. In this operating mode, the control circuit 8 applies a control signal to the second terminal 7 with a voltage higher than the threshold voltage of the low-voltage transistor so that it is switched to the on-state. At the same time, the control circuit transmits the switching signal, which is applied to the second input of the control circuit 8, to the first terminal 3, so that the high-voltage transistor 5 is switch-controlled. In this operating mode, the power supply voltage sources VDR+, VDR− of the active elements of the device are controlled by the control circuit 8 to be in operation, i.e., to deliver a first and a second voltage equal, within 10%, to their set voltages. Also in this operating mode, a protection circuit 11 (described in detail in a later section of this request) is inactive, i.e., it is controlled to be opened.

When the activation signal has a second level, different from the first one (e.g., 0V), the device 1 is in stand-by operation, i.e., it is inactive. In this operating mode, the control circuit 8 applies a control signal to the second terminal 7 with a voltage lower than the threshold voltage of the low-voltage transistor 6 in order to switch it to the off-state. At the same time, the control circuit 8 applies a zero or sufficiently low voltage to the first terminal 3 so that the high-voltage transistor 5 is in an off-state via the driver circuit 4. Also in this mode, the voltage sources supplying power to the active elements of the device, and, in particular, to the driver circuit 4, are controlled by the control circuit 8 to be turned off.

The activation of the switching device 1, i.e., the switching from the inactive to the active mode, is detected by the control circuit 8 on a rising edge of the activation signal. On this rising edge, the control circuit 8 initiates the establishment of the voltage sources that supply the active elements of the device. When these are well established, the control circuit places the device 1 in normal operating mode as described above. If these voltages cannot be established correctly, the control circuit 8 keeps the device 1 in the inactive mode, i.e., both the high-voltage transistor and the low-voltage transistor are controlled to be in the off-state. The control circuit 8 may signal this malfunction through an additional signal (not shown in FIG. 1).

"Correctly establishing the voltage sources" means that they deliver a voltage equal, within 10%, to their set voltages. The control circuit 8 is connected to the sources VDR+, VDR− via the connections 15a, 15b, which allows it to receive the voltages actually delivered by these sources and to compare them with the set voltages. The control circuit 8 is thus able to detect the good operating condition thereof.

The deactivation of the switching device 1, i.e., the switching from the active mode to the inactive mode, is detected by the control circuit 8 on a falling edge of the activation signal. On this falling edge, the control circuit triggers, during a first step, the application of a zero or sufficiently low voltage on the first terminal 3 to switch the high-voltage transistor 5 to the off-state, via the driver circuit 4. Then, in a second step, the control circuit 8 applies a voltage to the second terminal 7, causing the low-voltage transistor to be off-state. The control circuit 8 then controls the turning off of the voltage sources supplying the active elements of the device 1, in particular, the sources VDR+, VDR− of the driver circuit 4, and therefore the voltages delivered by these sources can no longer be guaranteed.

The deactivation of the switching device 1 may be caused by events other than a falling edge of the activation signal. This may, for example, be an event indicating a failure or an event that could cause a failure of the switching device. For example, if, when the switching device 1 is in active mode, the control circuit 8 detects that the first voltage and/or second voltage supplied by the voltage sources VDR+, VDR− to the driver circuit 4 deviate(s) by more than 10% from their set values, it may cause the device 1 to switch to the inactive state.

As seen in the preamble to this application, in the inactive mode, the gate of the high-voltage transistor has a floating voltage, which can be affected by the voltage developing on the drain of the high-voltage transistor 5 due to the coupling effect. This transistor can then switch uncontrolled from an off-state state to an on-state, which can damage the switching device 1, in particular, the low-voltage transistor 6.

In order to prevent this phenomenon, the switching device 1 includes, according to another aspect of the disclosure, a protection circuit 11 normally-on electrically connected between the second terminal 7 and the gate of the high-voltage transistor 5.

The function of the protection circuit 11 is to switch and keep the high-voltage transistor 5 in the off-state when the driver circuit is not electrically powered. The protection circuit 11 is normally-on, it does not require an electrical power supply to perform its function, and it can operate even in the absence of the device supply voltages, when the device is deactivated. When the switching device is in active operating mode, the protection circuit is controlled to be deactivated. It therefore constitutes an integrated safety protection circuit (commonly referred to as "fail safe").

When the switching device 1 is inactive, the output of driver circuit 4 has a high impedance. The gate voltage of the high-voltage transistor 5 is therefore floating and uncontrolled. The protection circuit therefore aims to place this voltage at a given value, thus switching the high-voltage transistor 5 to the off-state. This avoids applying the entire voltage of the generator G to the terminals of the low-voltage transistor 6, which could damage it.

Figure 3:
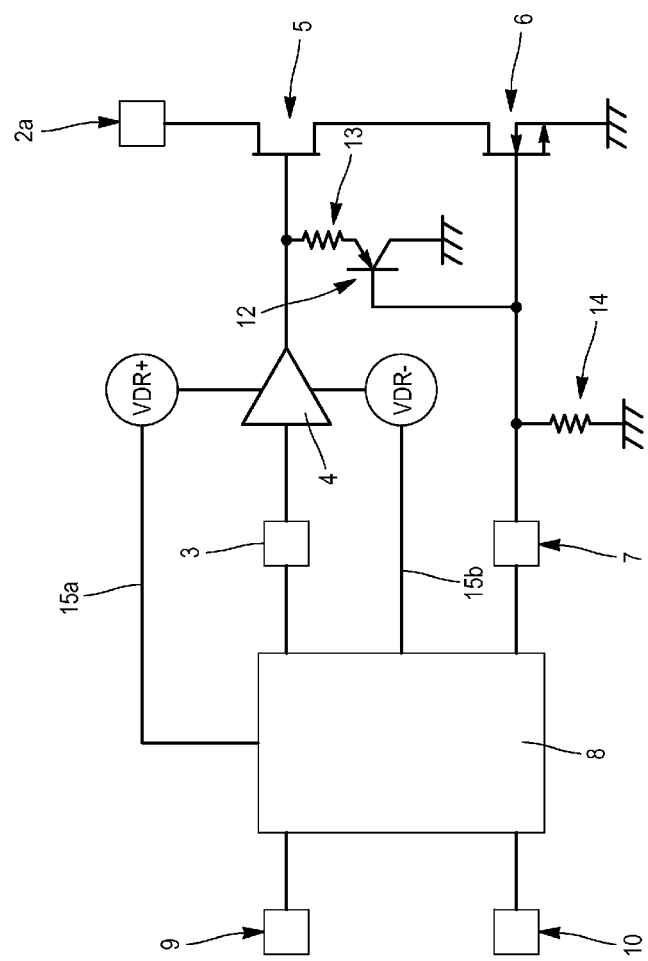
FIG. 3 shows a specific exemplary embodiment of the disclosure.

FIG. 3 illustrates a first embodiment of this aspect of the disclosure. The two switching terminals 2a, 2b, the high-voltage transistor 5, the low-voltage transistor 6, the driver circuit 4, the control circuit 8 and the two terminals 3, 7 already described in relation to the general description of the disclosure can be identified in this figure.

The protection circuit 11 consists of a PNP bipolar transistor 12 and a resistor 13 placed in the emitter of the bipolar transistor 12.

The base of the bipolar transistor 12 is electrically connected to the second terminal 7. The collector is placed at the ground of the device and the electrical resistor 13 connected to the gate of the high-voltage transistor 5.

The protection circuit also includes a second resistor 14 between the second input terminal 7 and the ground of the device.

When the control signal of the device 1 is higher than the threshold voltage of the low-voltage transistor, and therefore when the switching device 1 is actively operating, the bipolar transistor 12 is open and the protection circuit 11 has no influence on the operation of the high-voltage transistor 5 and therefore of the switching device 1 as a whole.

More precisely, this condition is met when the base voltage of the bipolar transistor 12 is greater than the voltage of its emitter. The base voltage corresponds to the control of the gate of the low-voltage transistor 6. The emitter voltage is alternately equal to the first and second voltage delivered by the voltage sources VDR+, VDR− of the driver circuit. So that the bipolar transistor 12 is effectively open during the normal operation of the device, the control voltage of the low-voltage transistor is so selected as to be higher than the first voltage delivered by the voltage source VDR+ of the driver circuit 4.

If, on the contrary, the control signal of the switching device 1 is lower than the threshold voltage of the low-voltage transistor 6, and therefore when the switching device is in inactive mode, the bipolar transistor 12 is closed on the first grounded resistor 13. The circuit that is formed then leads to placing the gate voltage of the high-voltage transistor at a voltage close to 0V. The source of the high-voltage transistor is put, when the low-voltage transistor is in an off-state mode, substantially at the avalanche voltage of this low-voltage transistor (which can be of the order of 30V). A voltage is therefore applied between the gate and the source of the high-voltage transistor which is below its threshold voltage, guaranteeing its off-state.

Of course, the disclosure is not limited to the mode of implementation described and alternative embodiments can be provided without going beyond the scope of the disclosure as defined by the claims.

Thus, although a switching device combining a protection circuit associated with a control circuit has been disclosed, each of these elements can be operated separately in switching devices with a different architecture from the one described above.

To avoid any doubt, the terms "electrically connected" or "electrically linked" in this description are used to indicate that two elements are directly or indirectly connected to each other.

The invention claimed is:

1. A power circuit switching device comprising:
two switching terminals;
a high-voltage depletion mode transistor and a low-voltage enhancement mode transistor arranged in series between the two switching terminals, the avalanche voltage of the low-voltage transistor being lower than the avalanche voltage of the high-voltage transistor;
a first terminal for receiving a switching signal, electrically connected via a driver circuit to a gate of the high-voltage transistor;
a second terminal for receiving a control signal, electrically connected to the gate of the low-voltage transistor;
a normally-on protection circuit electrically connected between the second terminal and the gate of the high-voltage transistor to keep the high-voltage transistor in an off-state when the driver circuit is not electrically powered; and
a control device electrically connected to the first terminal and the second terminal for processing the control signal and selectively transmitting the switching signal.

2. The switching device according to claim 1, wherein the protection circuit comprises a bipolar transistor and a resistor placed in an emitter of the bipolar transistor.

3. The switching device according to claim 2, wherein the base of the bipolar transistor is electrically connected to the second terminal, a collector of the bipolar transistor is electrically connected to the ground of the device and the resistor is electrically connected to the gate of the high-voltage transistor.

4. The switching device according to claim 3, wherein the protection circuit includes a second resistor between the second terminal and the ground of the device.

5. The switching device according to claim 4, wherein a source of the high-voltage transistor is electrically connected to the drain of the low-voltage transistor.

6. The switching device according to claim 5, wherein the high-voltage transistor is a GaN- or SiC-based HEMT transistor.

7. The switching device according to claim 6, wherein the low-voltage transistor is a silicon-based MOSFET transistor.

8. The switching device according to claim 7, wherein the avalanche voltage of the high-voltage transistor is greater than 600V.

9. The switching device according to claim 8, further comprising a control device electrically connected to the first terminal and the second terminal for processing the control signal and selectively transmitting the switching signal.

10. The switching device according to claim 9, wherein the driver circuit is electrically powered by at least one supply voltage source (VDR+, VDR−).

11. The switching device according to claim 10, wherein the control device is electrically connected to the at least one supply voltage source for selectively switching it on or off.

12. The switching device according to claim 2, wherein the protection circuit includes a second resistor between the second terminal and the ground of the device.

13. The switching device according to claim 1, wherein a source of the high-voltage transistor is electrically connected to the drain of the low-voltage transistor.

14. The switching device according to claim 1, wherein the high-voltage transistor is a GaN- or SiC-based HEMT transistor.

15. The switching device according to claim 1, wherein the low-voltage transistor is a silicon-based MOSFET transistor.

16. The switching device according to claim 1, wherein the avalanche voltage of the high-voltage transistor is greater than 600V.

17. The switching device according to claim 1, wherein the driver circuit is electrically powered by at least one supply voltage source (VDR+, VDR−).

18. The switching device according to claim 17, wherein the control device is electrically connected to the at least one supply voltage source for selectively switching it on or off.

19. A power circuit switching device comprising:
   two switching terminals;
   a high-voltage depletion mode transistor and a low-voltage enhancement mode transistor arranged in series between the two switching terminals, an avalanche voltage of the low-voltage transistor being lower than the avalanche voltage of the high-voltage transistor;
   a first terminal for receiving a switching signal, electrically connected via a driver circuit to a gate of the high-voltage transistor;
   a second terminal for receiving a control signal, electrically connected to the gate of the low-voltage transistor; and
   a normally-on protection circuit electrically connected between the second terminal and the gate of the high-voltage transistor to keep the high-voltage transistor in an off-state when the driver circuit is not electrically powered, the normally-on protection circuit comprising a bipolar transistor and a resistor placed in an emitter of the bipolar transistor.

* * * * *